United States Patent [19]

Nechtow et al.

[11] 3,874,918

[45] Apr. 1, 1975

[54] STRUCTURE AND PROCESS FOR SEMICONDUCTOR DEVICE USING BATCH PROCESSING

[75] Inventors: Marshall I. Nechtow, Torrance; Jiri Sandera, Manhattan Beach, both of Calif.

[73] Assignee: TRW Inc., Los Angeles, Calif.

[22] Filed: Feb. 19, 1974

[21] Appl. No.: 443,781

[52] U.S. Cl. ............ 117/212, 317/234 S, 117/201, 117/213

[51] Int. Cl. ............ B44d 1/18, H01l 3/00

[58] Field of Search ............ 117/212, 201, 213; 317/234 S

[56] References Cited

UNITED STATES PATENTS 3,632,432 1/1972 Sandera ............ 117/201

*Primary Examiner*—John D. Welsh

[57] ABSTRACT

A fabrication process and structure for semiconductor devices allowing a large number of devices to be made utilizing batch processing techniques without individual handling of the devices. The process includes forming a plurality of mesas on a semiconductor wafer, each of which contains a semiconductor junction, coating the wafer with a thick glass coating, etching tapered holes in the glass over the mesas, and plating a contact onto the mesa filling the tapered holes. Diodes made according to the process display low capacitance and inductance, high reliablility and high power dissipation characteristics.

14 Claims, 11 Drawing Figures

STRUCTURE AND PROCESS FOR SEMICONDUCTOR DEVICE USING BATCH PROCESSING

BACKGROUND OF THE INVENTION

1. Field of the Invention

This invention relates to semiconductor devices and more particularly to semiconductor devices which operate at high frequencies and high powers.

2. Prior Art

Since an IMPATT diode is intended to operate at high frequencies (at, for example, 10 gigahertz) and substantial power is dissipated at the junction, it is necessary that the leads to the diode have low inductance and capacitance, and that efficient means be provided to remove heat from the device.

In order to meet these requirements, the usual IMPATT diode is made by starting with a semiconductor wafer having an epitaxial low conductivity layer thereon, diffusing a very shallow layer of opposite conductivity material into the surface (say 0.5 micron depth) and then plating a heavy copper layer over the thin diffused layer. A pattern of grooves is then etched through the semiconductor material leaving many small isolated regions of the semiconductor on the copper disc. The copper is then cut along the grooves resulting in many small pieces of semiconductor material having one side plated with copper.

The pieces obtained are IMPATT diodes and are individually assembled into packages by soldering or bonding the copper portion to a base and bonding a thin wire to the semiconductor surface opposite to make the second contact.

The copper, being about 0.5 microns from the junction, efficiently removes heat from the junction area, and the packaged junction with the thin wire connection on the opposite surface has little capacitance. The self inductance of such a thin wire lead, however, is at times a problem.

The necessity of individually handling each of the devices to package them increases the cost substantially and precludes the possibility of producing a low cost IMPATT diode. The package of the invented diode, being an integral part of the diode, produced by batch processing methods allows the cost of manufacture to be significantly reduced.

This is accomplished by making the heat dissipating contact (the contact close to the junction) conical in shape so that it is a good heat conductor but still does not result in large capacitance. The self inductance of such a contact is also very low. A conical hole in a thick glass coating over the junction area gives the contact, which is plated onto the device through the hole, mechanical support.

A number of references have been noted in the prior art which disclose contacts to semiconductor devices through holes in a glass coating. None of these, however, utilize a member having a conical shape, or even the plating of contacts through holes in glass. Also, where discussed, the thickness of glass used in these prior art devices appears to be of the order of a few microns.

HUTSON, U.S. Pat. No. 3,632,434, discloses coating an entire wafer with glass, then etching holes in the glass for lead attachment. No method for lead attachment is described.

HAMPIKIAN, U.S. Pat. No. 3,460,003, shows a transistor haaving its top surface coated with glass and holes etched through the glass for contacts. The contacts disclosed are stamped from foil and ultrasonically welded.

KILE, U.S. Pat. No. 3,331,994, shows a thin film circuit having a tungsten glass coating in which holes are etched for contacts. No particular means of making the contacts are disclosed.

GEE, U.S. Pat. No. 3,323,956, has a structure which involves plating a contact on the junction, coating with glass, etching a hole in the glass over the contact and plating an additional thickness of contact material onto the exposed contact.

SUMMARY OF THE INVENTION

The invention described is applicable to a variety of semiconductor devices where good power dissipation, low capacitance, and low lead self inductance are required. Such a device is an IMPATT diode and hence the invention will be described with particular reference to an IMPATT diode for purposes of illustration and example. It will be understood, however, that the invention has broader applicability than the particular device described.

An IMPATT diode (IMPact Avalanche and Transit Time diode) is a particular form of diode which exhibits negative resistance characteristics and is suitable for use as a generator of microwave oscillations. The stray capacitance and inductance must be kept low and the thermal resistance from the junction to a heat sink must also be kept low. Prior art devices having the required characteristics are relatively expensive due to the individual handling required in their manufacture.

The IMPATT diode described for purposes of illustration comprises a die of semiconductor material typically 0.025 × 0.025 inches, 0.0015 inches thick. On one surface is a plated contact which may be copper. Nickel or iron may be used if desired, since their magnetic properties could be used to advantage in handling the finished device. The opposite surface of the die has a small mesa with a shallow diffused semiconductor junction. The junction is typically 0.5 to 1 micron deep. A heavy coating of glass covers the side of the die containing the junction and a substantially conical hole through the glass alows a silver contact to be plated onto the device filling up the conical hole. The plating material is preferably silver for its heat conductivity characteristics but could be copper or other metal.

The described diode needs no packaging, being entirely protected by the glass and the contacts, and can be completely fabricated using batch techniques with attendant low cost. The conical contact shape allows heat to flow from the junction with little temperature gradient and yet the capacitance of the unit and lead selfinductance are both very low, allowing operation at microwave frequencies. The unit is especially useful at the higher microwave frequencies.

DESCRIPTION OF THE DRAWINGS

FIGS. 2 through 12 are cross sectional views of a portion of the wafer being processed at successive stages in the process.

DETAILED DESCRIPTION

The invented structure and process will be described, using by way of example, an IMPATT diode. The high power densities possible and the low stray capacitance and inductance achieved by use of the fabrication method described are characteristics which are desirable for many applications, including IMPATT diodes.

The configuration of a typical IMPATT diode is a high conductivity *n*+ layer having a relatively thin *n* layer ( say 10 microns thick ) epitaxially deposited thereon and a very thin (0.5 to 1 micron) *p*+ layer diffused into the *n* layer. The diode junction is thus very close to one surface of the diode and efficient means for dissipating the heat generated in the junction should be provided. A *p*+, *p*, *n*+ configuration is also useful but the present invention will be described in connection with the more popular *n*+, *n*, *p*+ structure.

Figure 1:
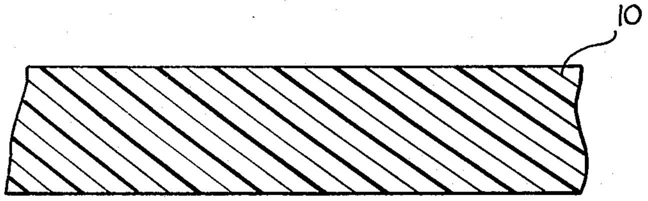
FIG. 1 is a cross sectional view of a portion of a semiconductor wafer to be processed in accordance with the invented process.
Figure 1A:
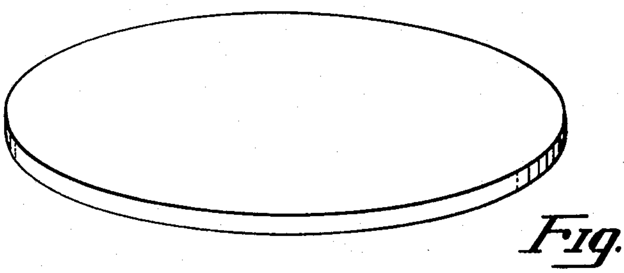
FIG. 1A is a perspective view of the wafer to be processed.
Figure 2:
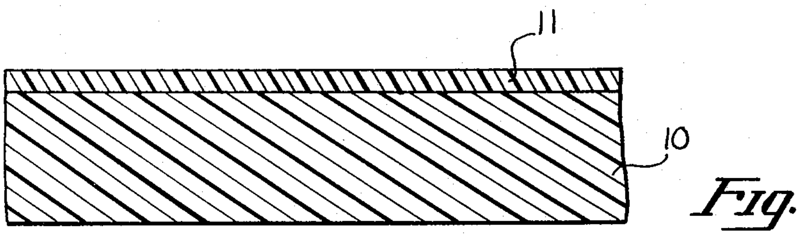
Figure 3:
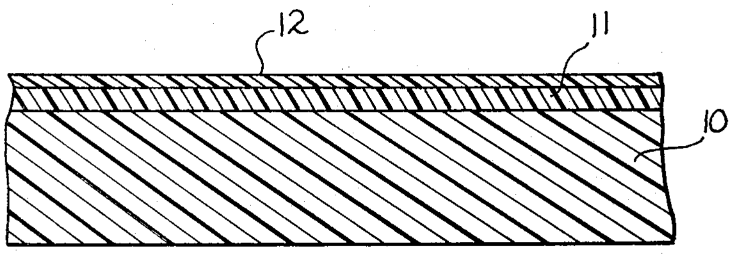

The starting point for the present structure is a wafer 10 of *n*+ conductivity type semiconductor material of any convenient diameter and thick enough to handle easily. A wafer about 0.005 inches thick is usually satisfactory. The wafer is typically 1½ inches in diameter and 2,000 diodes can conveniently be fabricated from one such wafer. On one surface of the wafer 10, a layer 11 of *n* conductivity semiconductor material is epitaxially deposited as is shown in FIG. 2. The layer 11 is typically 10 microns thick and covers the entire surface. The actual thickness depends upon the operating frequency of the diode. A layer 12 of *p*+ conductivity material is then diffused into layer 11 to a depth of about 0.5 to 1 micron as shown in FIG. 3.

Figure 4:
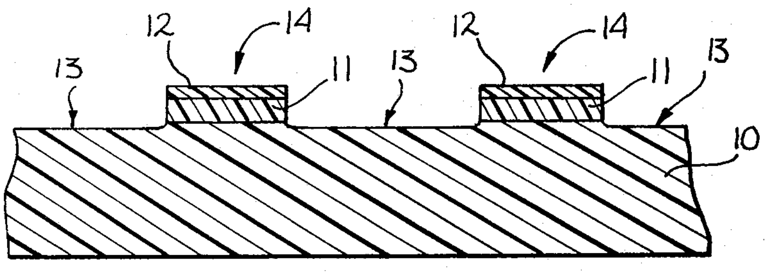
Figure 4A:
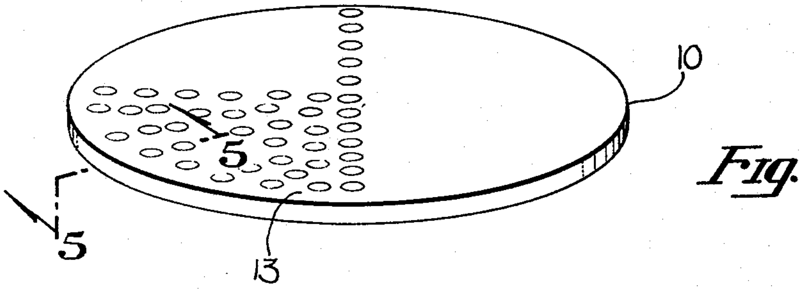

Using standard masking and etching techniques, a pattern of grooves 13 is etched in the surface of the wafer leaving a plurality of mesas 14 thereon as illustrated in the perspective view of FIG. 4A and the partial sectional view of FIG. 4. The etched grooves 13 remove all of the layers 11 and 12 in the area of the grooves so that the starting material of wafer 10 is exposed between the mesas 14. It should be noted that since there is such a large difference in the actual thicknesses of the various layers, it is not practical to draw same to a fixed scale and thus the drawings should be considered as illustrative only and not representative of the actual unit sizes. Also, while typical dimensions are given herein, it should be understood that practical devices having grossly different dimensions can be made, still within the spirit of the present invention. Typical mesas 14 are of the order of 0.005 inches square and the grooves between mesas 0.030 inches in width.

Figure 5:
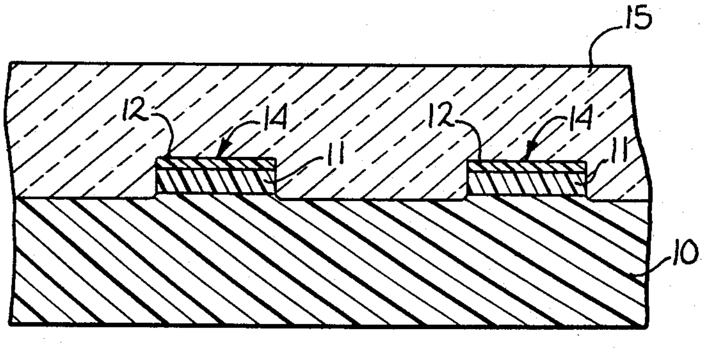

After creation of the mesas, the entire wafer, on the side having the mesas thereon, is coated with a thick layer of glass 15 as shown in FIG. 5. A suitable glass thickness is 0.010 inches. The glass imparts structural rigidity and strength to the wafer allowing the wafer to be handled conveniently in later steps of the process and also the glass provides protection for the finished device and a form for the contact which eventually will be plated onto the diffused layer 12. As will be discussed later, the stray capacitance of the finished unit is affected by the thickness of the glass, the thicker the glass, the lower the capacitance.

Since the glass is in initimate contact with the semiconductor material, it is necessary that the linear coefficient of expansion of the glass and the semiconductor material be closely matched lest the differential expansion cause cracking of either the glass or the semiconductor. In the manufacture of silicon devices, it has been found that a glass having about 49% $SiO_2$, 3% $Al_2O_3$, and 48% PbO, will match the coefficient of silicon closely enough to avoid problems from this source.

The glass is applied to the wafer as a frit in an organic solvent. Heating of the coated wafer to a temperature of about 720°C evaporates the solvent and melts the frit so that a solid layer of glass is formed on cooling.

Figure 6:
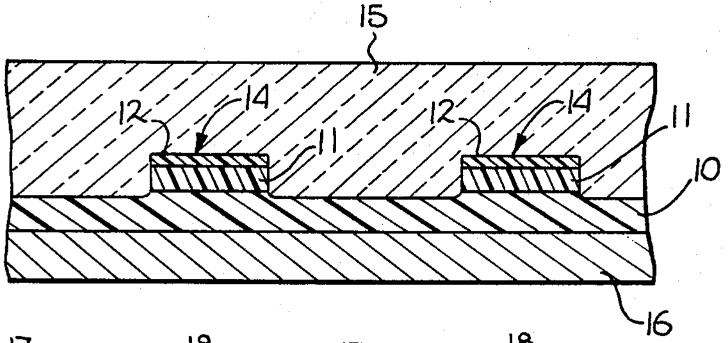

The surface of wafer 10 opposite that on which glass layer 15 appears is then etched until the wafer thickness is reduced to about 0.0015 or thinner, even to removing layer 10 underneath the glass completely. At this point, a backing metal layer 16 is plated over the surface of wafer 10 as shown in FIG. 6. The layer 16 can be of any convenient contact metal such as co-per, but iron or nickel may be advantageously used since their magnetic properties can be utilized as an aid in handling or for polarity identification.

Figure 7:
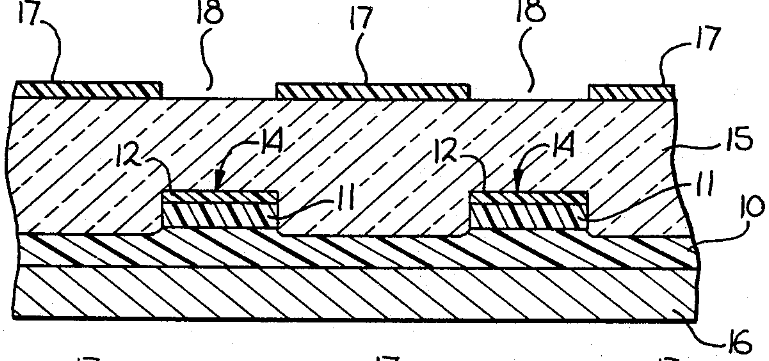

The surface of glass layer 15 is next covered with mask 17, utilizing standard semiconductor fabrication techniques, (FIG. 7) and windows 18 are opened in the mask, the windows being about the size as mesas 14 and in registration therewith.

Figure 8:
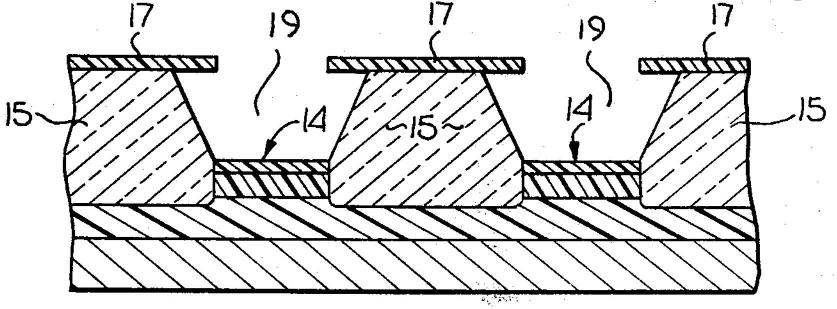
Figure 9:
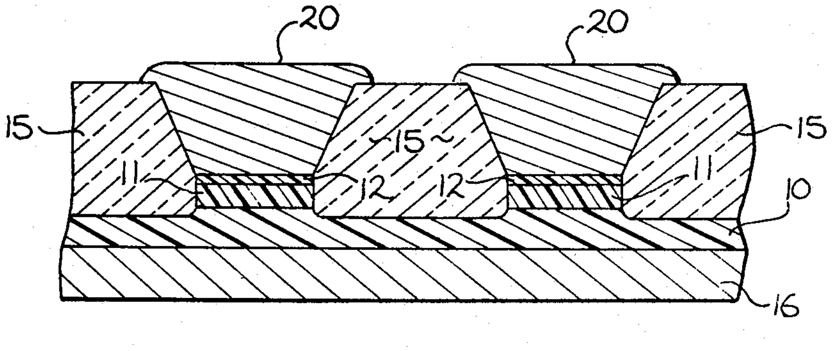

The glass under windows 18 is then etched away down to the mesas 14. In the process of etching the etchant removes material laterally as well as vertically creating thereby a substantially conical hole 19 as shown in FIG. 8. The masking material 17 is then removed and conical hole 19 is filled by plating metal contacts 20 into the hole 19 as shown in FIG. 9. The metal used is preferably silver because of its high coefficient of thermal conductivity, but other metals, for example, copper, are also suitable.

The individual diodes, now in their completed form, are cut apart and are ready for use. Thus, it is seen that by utilizing the principles of the present invention, it is possible to manufacture diodes wherein all of the manufacturing steps are on a batch basis and the individual diodes need only be handled at the conclusion of manufacture.

What is claimed is:

1. A method of fabrication of semiconductor devices which comprises the steps of:

a. forming a semiconductor junction on one surface of a wafer of semiconductor material;
b. etching areas of said surface of said wafer whereby a plurality of mesas are formed on said wafer, each of said mesas containing a semiconductor junction;
c. coating the side of said wafer containing said mesa with glass, the thermal coefficient of expansion of said glass being substantially the same as said wafer;
d. forming a mask on the surface of said glass whereby the area of said mesas is not covered by said mask;
e. etching said glass in the areas not covered by said mask whereby substantially conical holes are etched in said glass over said mesas; and
f. plating metal in said conical holes.

2. The method of claim 1 where the thickness of said coating of glass is greater than the distance across said mesas.

3. The method of claim 1 and further including the step of depositing a layer of metal on the surface of said wafer opposite said coating of glass.

4. The method of claim 3 and further including the step of reducing the thickness of said wafer prior to depositing said layer of metal on the surface of said wafer.

5. The method of claim 4 where said metal is iron or nickel.

6. The method of processing a semiconductor wafer which comprises the steps of:

a. forming a plurality of mesas on one surface of said wafer, said mesas each containing a semiconductor junction;
b. forming a coating of glass over said mesas;
c. forming a plurality of tapered holes in said coating of glass whereby the top surface of said mesas is exposed; and
d. plating metal in said tapered holes whereby ohmic contacts with the top surfaces of said mesas are made.

7. The method of claim 6 where said tapered holes are formed by a. masking the surface of said coating of glass, said mask having openings therein corresponding to said plurality of mesas; and
b. applying acid to said coating of glass through said openings whereby tapered holes will be etched through said coating of glass.

8. The method of claim 7 where said coating of glass is thicker than the distance across said mesas.

9. The method of claim 8 and further including the step of cutting said wafer into a plurality of pieces, said pieces containing one or more of said mesas.

10. The method of fabricating a plurality of diodes on a semiconductor wafer which comprises the steps of:

a. forming a layer of semiconductor material on one surface of said wafer, said semiconductor material being of opposite conductivity type as said wafer;
b. isolating a plurality of areas of said layer of semiconductor material from each other by selectively removing portions of said layer of semiconductor material whereby a plurality of mesas are formed on said wafer;
c. coating said wafer with a layer of glass;
d. forming a plurality of tapered holes in said glass whereby said mesas are exposed; and
e. plating an ohmic contact to said mesas through said tapered holes.

11. The process of fabricating a plurality of IMPATT diodes which comprises the steps of:

a. epitaxially depositing a layer of moderate carrier concentration semiconductor material on a high carrier concentration semiconductor substrate of the same conductivity type material;
b. diffusing a layer of high carrier concentration semiconductor material of opposite conductivity type into said epitaxial layer;
c. selectively etching away said diffused layer and said epitaxial layer whereby a plurality of mesas are formed on said substrate;
d. coating the surface of said substrate containing said mesas with glass;
e. etching tapered holes in said glass whereby said mesas are exposed; and
f. plating contacts on said mesas through said tapered holes.

12. A diode which comprises:

a. a substrate of first conductivity semiconductor material;
b. a layer of second conductivity semiconductor material on one surface of said substrate, said layer covering only a portion of said surface;
c. a layer of glass on said surface of said substrate, said layer of glass having an opening corresponding to the location of said layer of semiconductor material, said opening being larger at the surface of said layer of glass than at said layer of semiconductor material; and
d. a plated metal contact substantially filling said opening.

13. The diode of claim 12 where the thickness of said coating of glass is greater than the size of said mesas.

14. The diode of claim 13 and further including a layer of metal plated on the surface of said substrate opposite said coating of glass.

* * * * *